United States Patent [19]

Ogawa

[11] Patent Number: 5,045,709

[45] Date of Patent: Sep. 3, 1991

[54] OPTICALLY COUPLED SOLID STATE RELAY WITH DUAL DISCHARGING CIRCUITS

[75] Inventor: Kenji Ogawa, Tokyo, Japan

[73] Assignee: NEC Corporation, Japan

[21] Appl. No.: 539,903

[22] Filed: Jun. 18, 1990

[30] Foreign Application Priority Data

Jun. 19, 1989 [JP] Japan .................................. 1-157609

[51] Int. Cl.⁵ ............................................ G02B 27/00
[52] U.S. Cl. ..................................... 250/551; 307/311
[58] Field of Search ............... 250/551, 214 A, 214 R; 307/311

[56] References Cited

U.S. PATENT DOCUMENTS 4,390,790  6/1983  Rodriquez ........................... 250/551
4,419,586  12/1983  Phipps ................................. 250/551

Primary Examiner—David C. Nelms
Assistant Examiner—Que T. Le
Attorney, Agent, or Firm—Laff, Whitesel, Conte & Saret

[57] ABSTRACT

For preventing an optically coupled solid state relay with normally-open output terminals and normally-closed output terminals from undesirable concurrent on-state, the solid state relay comprises first and second photodiode arrays producing first and second photocurrents in the presence of an optical radiation produced in a light-emitting diode, an enhancement mode transistor coupled to the first photodiode array and controlling the normally-open output terminals, a depletion mode transistor coupled to the second photodiode array an controlling the normally-closed output terminals, and first and second discharging circuits for short circuiting the enhancement mode transistor and the depletion mode transistor in the absence of the optical radiation, respectively, in which the amount of the second photocurrent is larger than that of the first photocurrent and the enhancement mode transistor is larger in the absolute value of a threshold level than the depletion mode transistor, and in which the first discharging circuit extinguishes the residual charges faster than the second discharging circuit.

10 Claims, 10 Drawing Sheets

OPTICALLY COUPLED SOLID STATE RELAY WITH DUAL DISCHARGING CIRCUITS

FIELD OF THE INVENTION

This invention relates to a solid state relay and, more particularly, to a solid state relay of the type having a light-emitting device and a photo-detecting device for the switching action.

DESCRIPTION OF THE RELATED ART

Various solid state relays are manufactured and some of the solid state relays achieve switching actions with optical couplers. One of the optically coupled solid state relays is illustrated in FIG. 1 and largely comprises an optical coupler 1, a discharging circuit 2 and an output transistor 3. The optical coupler 1 is constituted by a light-emitting diode 1a coupled between input terminals 1b and 1c and a series combination of photodiodes 1e, and the series combination of the photodiodes 1e is optically isolated from the light-emitting diode 1a in the absence of an activating signal applied between the input terminals 1b and 1c and, accordingly, of an optical radiation 1f. The output transistor 3 is implemented by an n-channel type enhancement mode field effect transistor, and the source and drain electrodes thereof are coupled to normally-open output terminals 3a and 3b. The gate and source electrodes of the output transistor 3 are coupled to the both ends of the series combination of photodiodes 1e, and the discharging circuit 2 is coupled in parallel to the output transistor 3 between both ends of the series combination 1e. The discharging circuit 2 comprises an n-channel type depletion mode field effect transistor 2a coupled in parallel to the output transistor 3, a resistor 2b coupled between the gate and source electrodes of the depletion mode field effect transistor 2a and a series combination of photodiodes 2c coupled in parallel to the resister 2b.

The optically coupled solid state relay thus arranged behaves as follows. When the optical radiation 1f takes place, the series combinations 1e and 2c produces photocurrents, respectively. The photocurrent produced by the series combination 2c causes the depletion mode field effect transistor to turn off, but the output transistor 3 turns on in the presence of the photocurrent produced by the series combination 1e. Then, a current path is established between the output terminals 3a and 3b. However, if the optical radiation 1f is removed, the depletion mode field effect transistor 2a turns on so that a current path is established therethrough, and, accordingly, the output transistor 3 rapidly turns off for allowing the output terminals 3a and 3b to retrieve the initial state.

For speed-up of the switching action, a discharging circuit 12 is implemented by a thyristor 12a associated with two diodes 12b and 12c but other components are similar to those of the solid state relay shown in FIG. 1. The solid state relay shown in FIG. 2 behaves as similar to that shown in FIG. 1 but a faster turning-off speed is achieved because of the discharging circuit 12 implemented by the thyristor 12a.

The solid state relay shown in FIG. 1 has only the normally-open output terminals 3a and 3b controlled by the enhancement mode field effect transistor 3. However, if the series combination of the photodiodes 1e and the discharging circuit 2 are dualized and an n-channel type depletion mode field effect transistor is coupled to the other pair, the solid state relay has not only the normally-open output terminals but also normally-closed output terminals. FIG. 3 shows another prior art solid state relay of the type having normally-open output terminals and normally-closed output terminals, and the component elements similar to those shown in FIG. 1 are designated by the same reference numerals. The optical coupler 1 further has a second series combination of photodiodes 1g, and a second discharging circuit 22 is coupled between both ends of the second series combination of the photodiodes 1g. Between both ends of the second series combination 1g is further coupled a second output transistor 23 which is implemented by an n-channel type depletion mode field effect transistor 23. The second output transistor 23 is coupled between normally-closed output terminals 23a and 23b and provides a current path between the normally-closed output terminals 23a and 23b in the absence of the optical radiation 1f. The characteristics of the first output transistor 3 correspond to those of the second output transistor 23, and the first and second discharging circuits 2 and 22 are substantially identical in circuit properties with each other. Moreover, the photocurrents respectively produced by the photodiode arrays 1e and 1g are of the same level.

The second series combination 1g and the second discharging circuit 22 behaves as similar to the first series combination 1e and the first output circuit 2, but the second output transistor 23 is symmetrically shifted between on and off states with respect to the first output transistor 3. Then, the solid state relay shown in FIG. 3 is expected to achieve a transfer action where either of the two sets of output terminals 3a and 3b, or 23a and 23b is blocked at all times.

Other prior art examples are disclosed in U.S. Pat. Nos. 4,227,098, 4,390,790 and 4,754,175, respectively.

However, a problem is encountered in the prior art solid state relay for the transfer action in that both of the first and second output transistors 3 and 23 tend to transiently turn on to provide the current paths. This is because of the fact that fluctuation of the circuit properties tends to take place in the component circuits during the manufacturing stage, and such undesirable fluctuation results in the above mentioned transient concurrent onstates. The concurrent on-states are causative of undesirable short circuiting by way of example in a system incorporating the solid state relay, and the incredible transfer action deteriorates the reliability of the system.

SUMMARY OF THE INVENTION

It is therefore an important object of the present invention to provide an optically coupled solid state relay which is free from the problem inherent in the prior art relay for the transfer action.

To accomplish these objects, the present invention proposes to regulate the characteristics of two output transistors and respective circuit properties to different levels, respectively.

In accordance with the present invention, there is provided an optically coupled solid state relay comprising (a) an optical coupler having a light-emitting element coupled between input terminals for producing an optical radiation in the presence of a driving current, first photovoltaic means for producing a first photocurrent at a first voltage level in the presence of the optical radiation and second photovoltaic means for producing a second photocurrent at a second voltage level in the presence of the optical radiation, (b) a first output circuit having an enhancement mode field effect transistor coupled to the first photovoltaic means and provided in association with normally-open output terminals, (c) a first discharging circuit activated in the absence of the optical radiation and discharging the first voltage level, (d) a second output circuit having a depletion mode field effect transistor coupled to the second photovoltaic means and provided in association with normally-closed output terminals, and (e) a second discharging circuit activated in the absence of the optical radiation and discharging the second voltage level, in which the amount of the second photocurrent is larger than that of the first photocurrent and the enhancement mode field effect transistor is larger in the absolute value of a threshold level than the depletion mode field effect transistor so that the depletion mode field effect transistor turns off before the enhancement mode field effect transistor turns on, wherein the first discharging circuit starts in a discharging operation thereof earlier than the second discharging circuit so that the enhancement mode field effect transistor turns off before the depletion mode field effect transistor turns on.

BRIEF DESCRIPTION OF THE DRAWINGS

The features and advantages of a solid state relay according to the present invention will be more clearly understood from the following description taken in conjunction with the accompanying drawings in which.

DESCRIPTION OF THE PREFERRED EMBODIMENTS

First Embodiment

Figure 1:
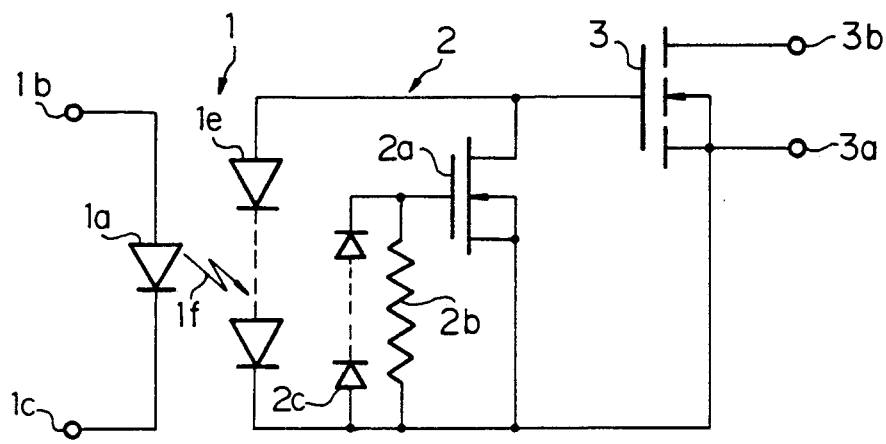
FIG. 1 is a circuit diagram showing the arrangement of a prior art optically coupled solid state relay.
Figure 2:
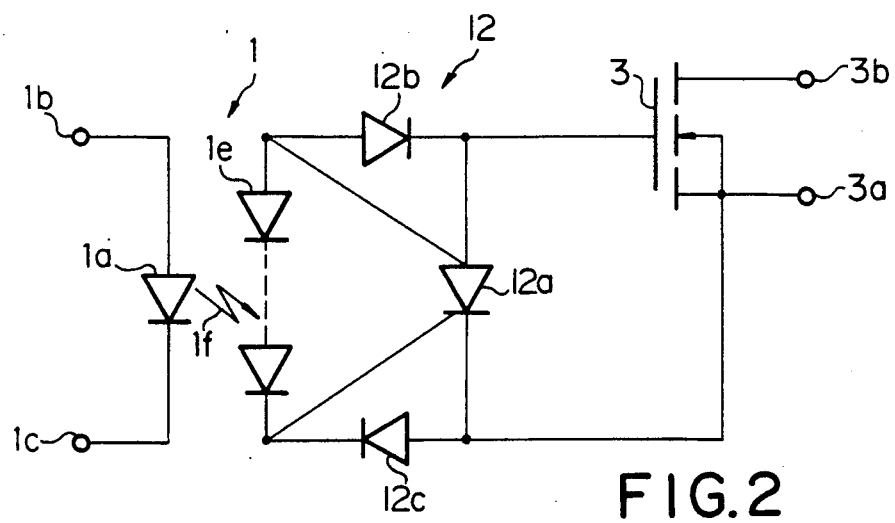
FIG. 2 is a circuit diagram showing the arrangement of another prior art optically coupled solid state relay.
Figure 3:
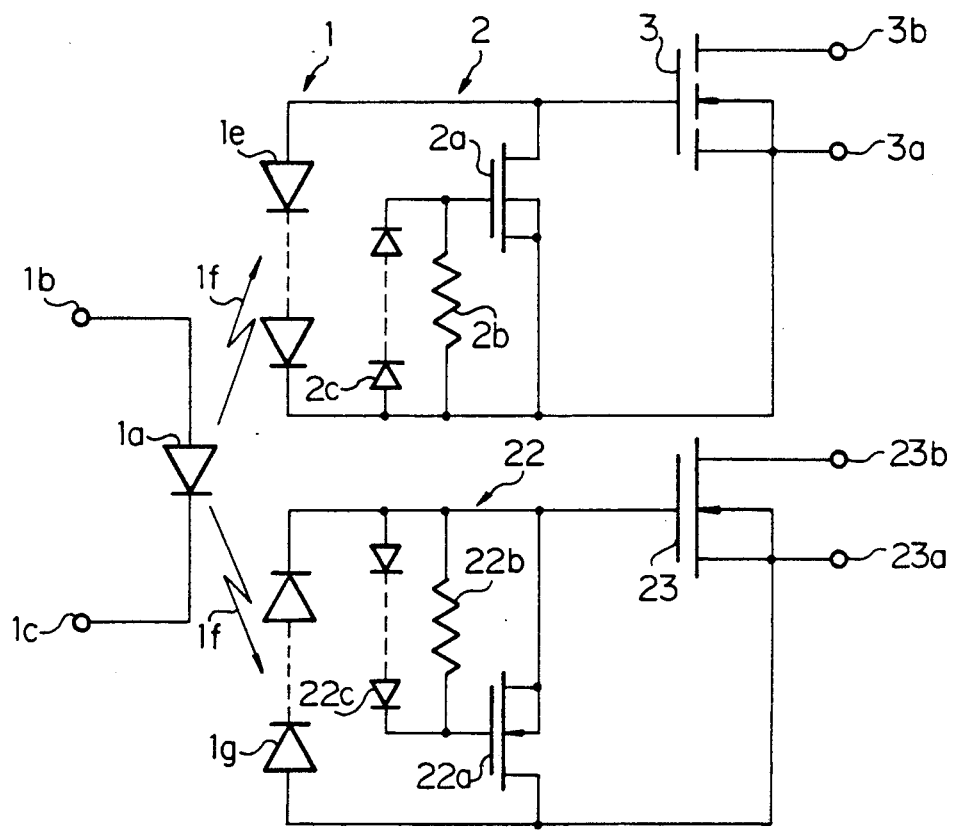
FIG. 3 is a circuit diagram showing the arrangement of still another prior art optically coupled solid state relay.
Figure 4:
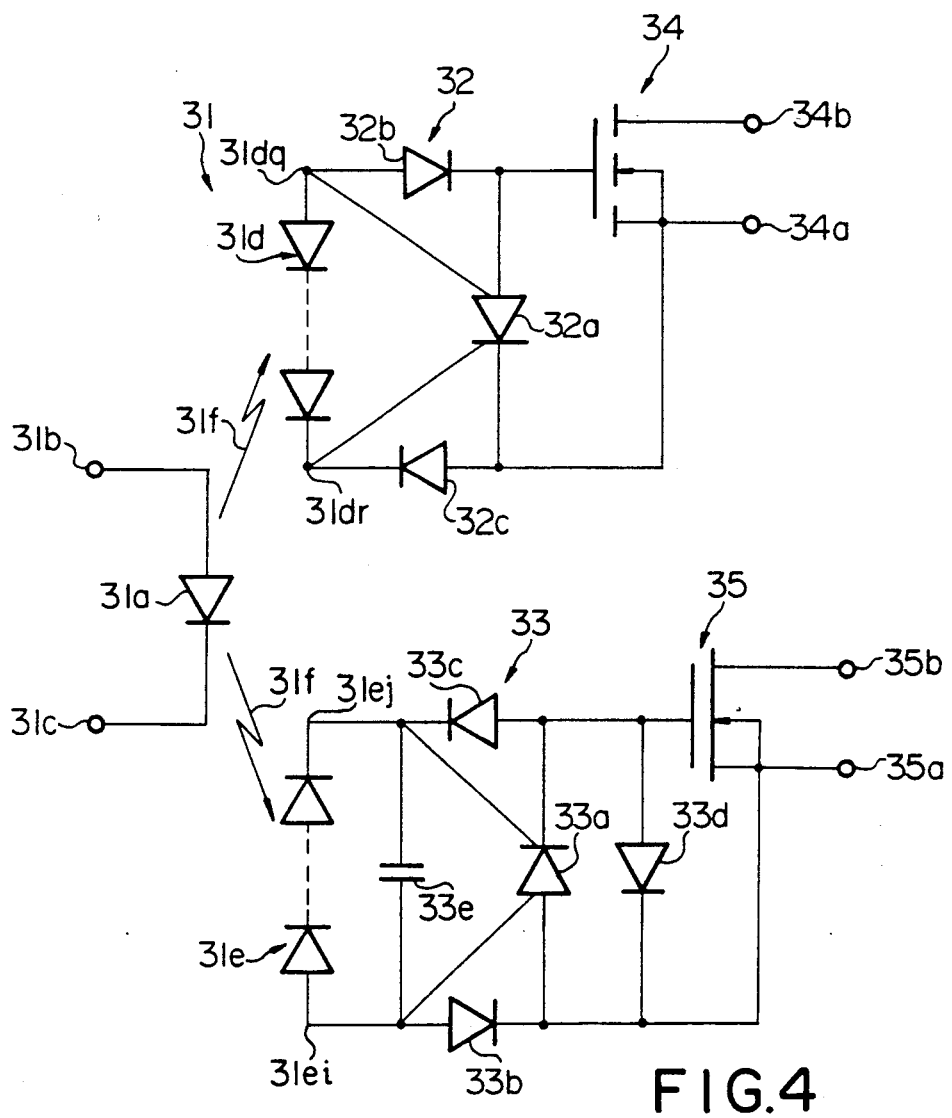
FIG. 4 is a circuit diagram showing the arrangement of an optically coupled solid state relay according to the present invention.
Figure 5:
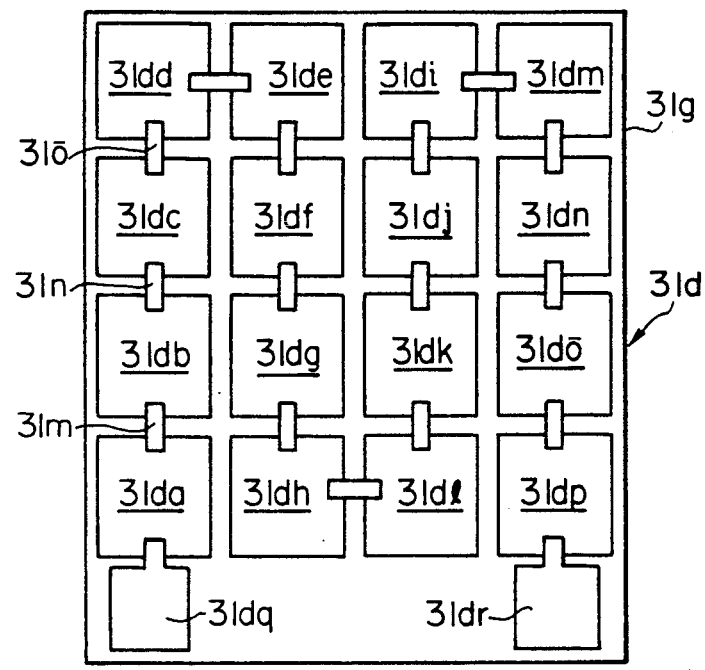
FIG. 5 is a plan view showing the arrangement of a first photodiode array incorporated in the solid state relay shown in FIG. 4.
Figure 6:
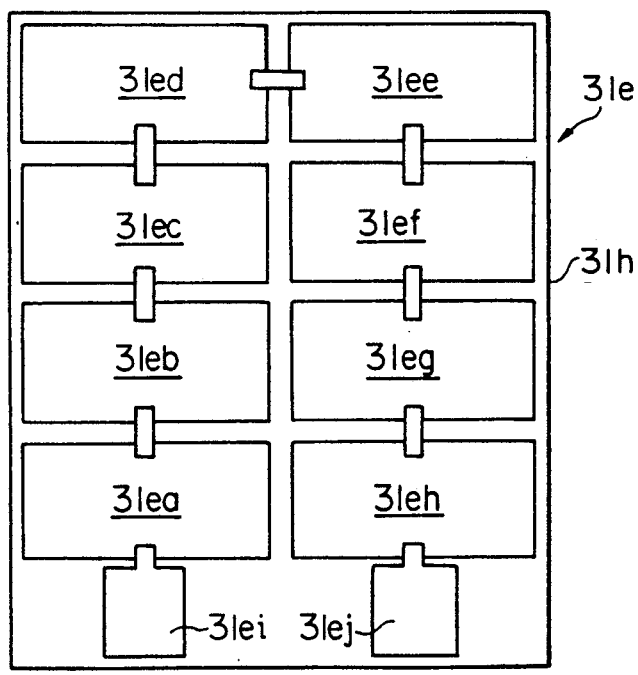
FIG. 6 is a plan view showing the arrangement of a second photodiode array incorporated in the solid state relay shown in FIG. 4.

Referring first to FIG. 4 of the drawings, an optically coupled solid state relay largely comprises an optical coupler 31, first and second discharging circuits 32 and 33 and first and second output circuits 34 and 35. The optical coupler 31 has a light-emitting diode 31a coupled between a pair of input terminals 31b and 31c, a first series combination of photodiodes or a first photodiode array 31d, and a second series combination of photodiodes or a second photodiode array 31e, and an optical radiation 31f produced by the light-emitting diode 31a causes the first and second photodiode arrays 31d and 31e to produce photocurrents, respectively. The first photodiode array 31d is implemented by sixteen photodiodes 31da to 31dp each having a plane figure of 200 microns by 200 microns, and the sixteen photodiodes 31da to 31dp are coupled in series through narrow aluminum strips on a dielectrically isolated substrate portion 31g as shown in FIG. 5. The second photodiode array 31e is constituted by eight photodiodes 31ea to 31eh each having a plane figure of 200 microns by 400 microns, and the eight photodiodes 31ea to 31eh are also coupled in series through narrow aluminum strips on a dielectrically isolated substrate portion 31h as shown in FIG. 6. Thus, the component photodiode is different in size between the first and second photodiode arrays 31d and 31e, and the number of component photodiodes is further difference therebetween. These differences result in that the first photodiode array 31d produces a relatively small amount of photocurrent but a relatively large voltage rather than the second photodiode array 31e. Such a relation between the voltage level and the amount of photocurrent results in that the second photodiode array 31e does not consume a wide real estate in comparison with the first photodiode array 31d. In this instance, the first and second photodiode arrays 31d and 31e respectively form first and second photovoltaic means.

Figure 7:
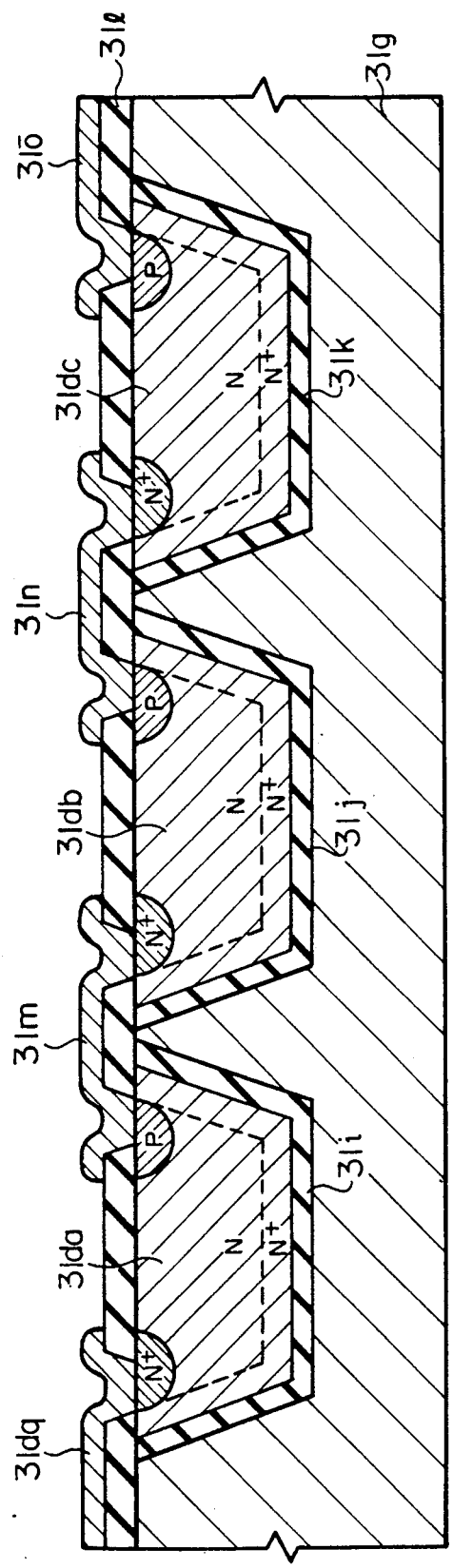
FIG. 7 is a cross sectional view showing the structure of the first photodiode array shown in FIG. 5.

FIG. 7 shows the structure of the first photodiode array 31d. The second photodiode array 31d is fabricated on a polysilicon layer serving as the substrate portion 31g, and the photodiodes such as 31da to 31dc are formed in islands defined in the polysilicon layer by thin silicon oxide films 31i, 31j and 31k, respectively. The photodiodes 31da to 31dc are covered with a silicon oxide film 31l, and the narrow aluminum strips 31m, 31n and 31o are provided on the silicon oxide film 311 for providing interconnections.

Turning back to FIG. 4, the first discharging circuit 32 comprises a first thyristor 32a and first and second diodes 32b and 32c, and the first thyristor 32a is coupled at the anode thereof to the cathode of the first diode 32b and at the cathode thereof to the anode of the second diode 32c. The first photodiode array 31d has a high voltage electrode 31dq and a low voltage electrode 31dr which are respectively coupled to the anode of the first diode 32b and the cathode of the second diode 32c. The first output circuit 34 is formed by an n-channel type enhancement mode field effect transistor (which will be hereinbelow designated by the same reference numeral 34 as that of the first output circuit), and the enhancement mode field effect transistor 34 is coupled between normally-open output terminals 34a and 34b. The enhancement mode field effect transistor 34 is coupled at the gate electrode thereof to the cathode of the first diode 32b, and the threshold voltage level of the enhancement mode field effect transistor 34 is adjusted to about 2.5 volts. The combination of the first discharging circuit 32 and the enhancement mode field effect transistor 34 associated with the first photodiode array 31d is similar in arrangement to that disclosed in U.S. Pat. No. 4,754,175.

The second discharging circuit 33 comprises a second thyristor 33a, third, fourth and fifth diodes 33b, 33c and 33d and a capacitor 33e. The second thyristor 33a is coupled at the anode thereof to the cathode of the third diode 33b and at the cathode thereof to the anode of the fourth diode 33c, and the anode and cathode of the fifth diode 33d are coupled to the cathode and anode of the second thyristor 33a, respectively. The second photodiode array 31e has a high voltage electrode 31ei and a low voltage terminal 31ej which are coupled to the anode of the third diode 33b and the cathode of the fourth diode 33c, respectively. The capacitor 33e is coupled between the high voltage electrode 31ei and the low voltage electrode 31ej. The second output circuit is implemented by an n-channel type depletion mode field effect transistor (which is also designated by the same reference numeral 35 as that of the second output circuit), and the depletion mode field effect transistor 35 is coupled between normally-closed output terminals 35a and 35b. The gate electrode of the depletion mode field effect transistor 35 is coupled to the anode of the fourth diode 33c, and the threshold voltage level thereof is adjusted to about −2 volts.

Description is hereinbelow briefly made on circuit behavior of the optically coupled solid state relay shown in FIG. 4. When a driving current is supplied between the input terminals 31b and 31c, the light-emitting diode 31a produces the optical radiation 31f which is fallen onto the first and second photodiode arrays 31d and 31e. Then, photocurrents respectively take place in the first and second photodiode arrays 31d and 31e. The first photocurrent is supplied through the first diode 32b to the gate electrode of the enhancement mode field effect transistor 34 and allows the gate electrode to exceed the threshold voltage level of about +2.5 volts. However, the first photocurrent at a first voltage level backwardly biases the first thyristor 32a, and the first thyristor 32a remains in the off-state. The second photocurrent at a second voltage level also negatively biases the gate electrode of the depletion mode field effect transistor 35 with respect to the source electrode thereof, and the depletion mode field effect transistor 35 turns off upon exceeding the threshold voltage level of about −2 volts; however, the second photocurrent allows the second thyristor to remain in the off-state. Thus, the first and second photocurrents allows the enhancement mode field effect transistor 34 and the depletion mode field effect transistor 35 to turn on and off, respectively. As described hereinbefore, the relatively large amount of the second photocurrent at the relatively small voltage level allows the depletion mode field effect transistor with the relatively small absolute value of the threshold level to turn off earlier than the enhancement mode field effect transistor, and, for this reason, no concurrent on-states never take place in both of the transistors 34 and 35.

If the driving current is removed from the input terminals 31b and 31c, the optical radiation 31f is extinguished, and each of the first and second photodiode arrays terminate the production of photocurrent. The voltage level across the first photodiode array 31d is gradually decreased due to a self-discharging phenomenon, and the first thyristor 32a turns on upon exceeding the threshold value. Then, the enhancement mode field effect transistor 34 rapidly turns off to cut off the current path between the normally-open output terminals 34a and 34b because the gate capacitance is discharged through the first thyristor 32a. Similarly, the second thyristor 33a turns on to allow the depletion mode field effect transistor 35 to turn on; however, the capacitor 33e and the fifth diode 33d retards the switching action of the depletion mode field effect transistor 35. Namely, since the fifth diode 33d is coupled in such a manner as to have a forward current opposite in direction to that of the second thyristor 33a, a leakage current pulls down the voltage level at the gate electrode of the depletion mode field effect transistor 35 and prevents the second thyristor 33a from turning on. On the other hand, the capacitor 33e supplements electric charges and retards the voltage decay across the second photodiode array 31e and, accordingly, the switching action of the second thyristor 33a. This means that the enhancement mode field effect transistor 34 turns off before the depletion mode field effect transistor 35 turns on.

In this instance, the second discharging circuit 33 incorporates not only the capacitor 33e but also the fifth diode 33d; however, one of them is effective against a rapid switching action from the off-state to the on-state. Thus, no concurrent on-states take place in the transistors 34 and 35 upon removing the optical radiation 31f.

Figure 8A:
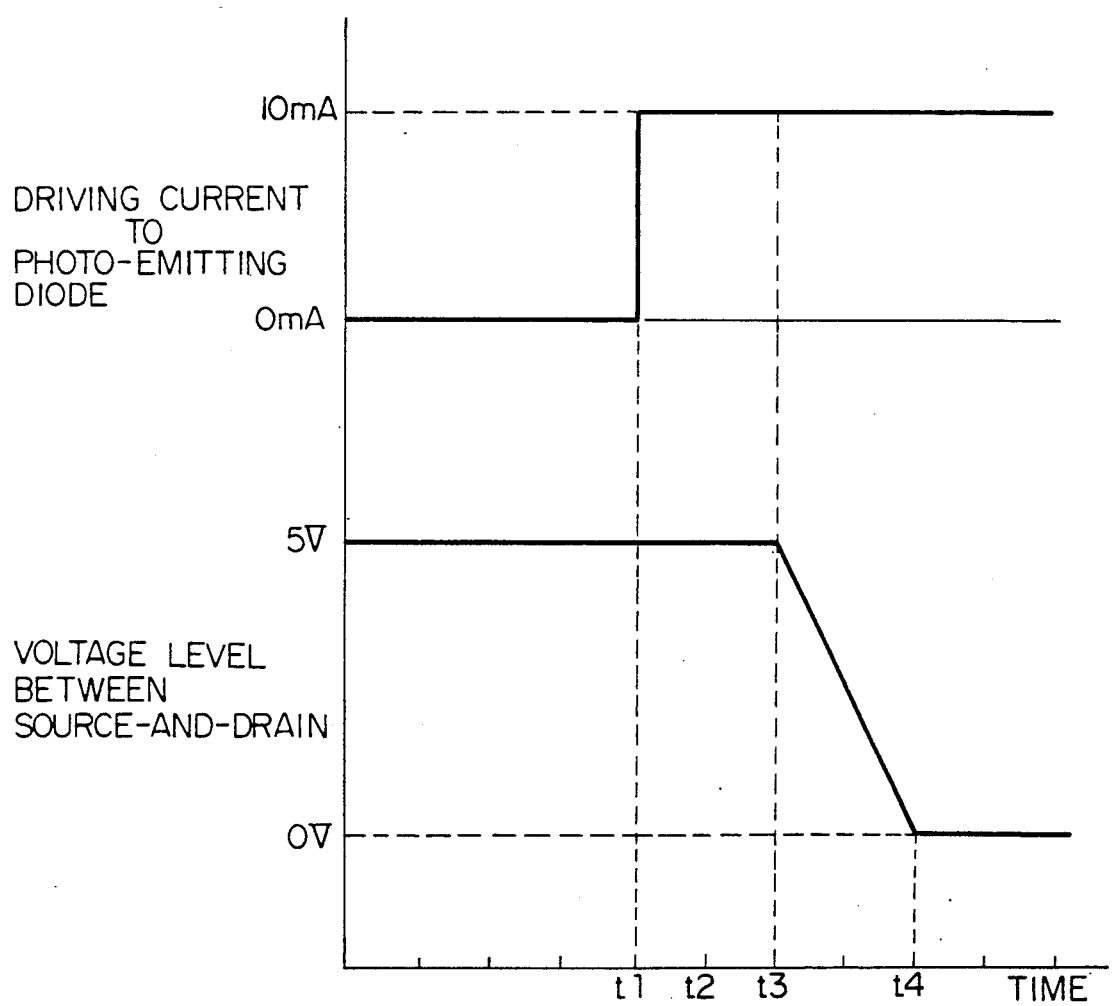
FIGS. 8A and 8B are diagrams showing the switching actions of an enhancement mode field effect transistor and a depletion mode field effect transistor both incorporated in the solid state relay shown in FIG. 4 upon application of a driving current to a light-emitting diode.
Figure 8B:
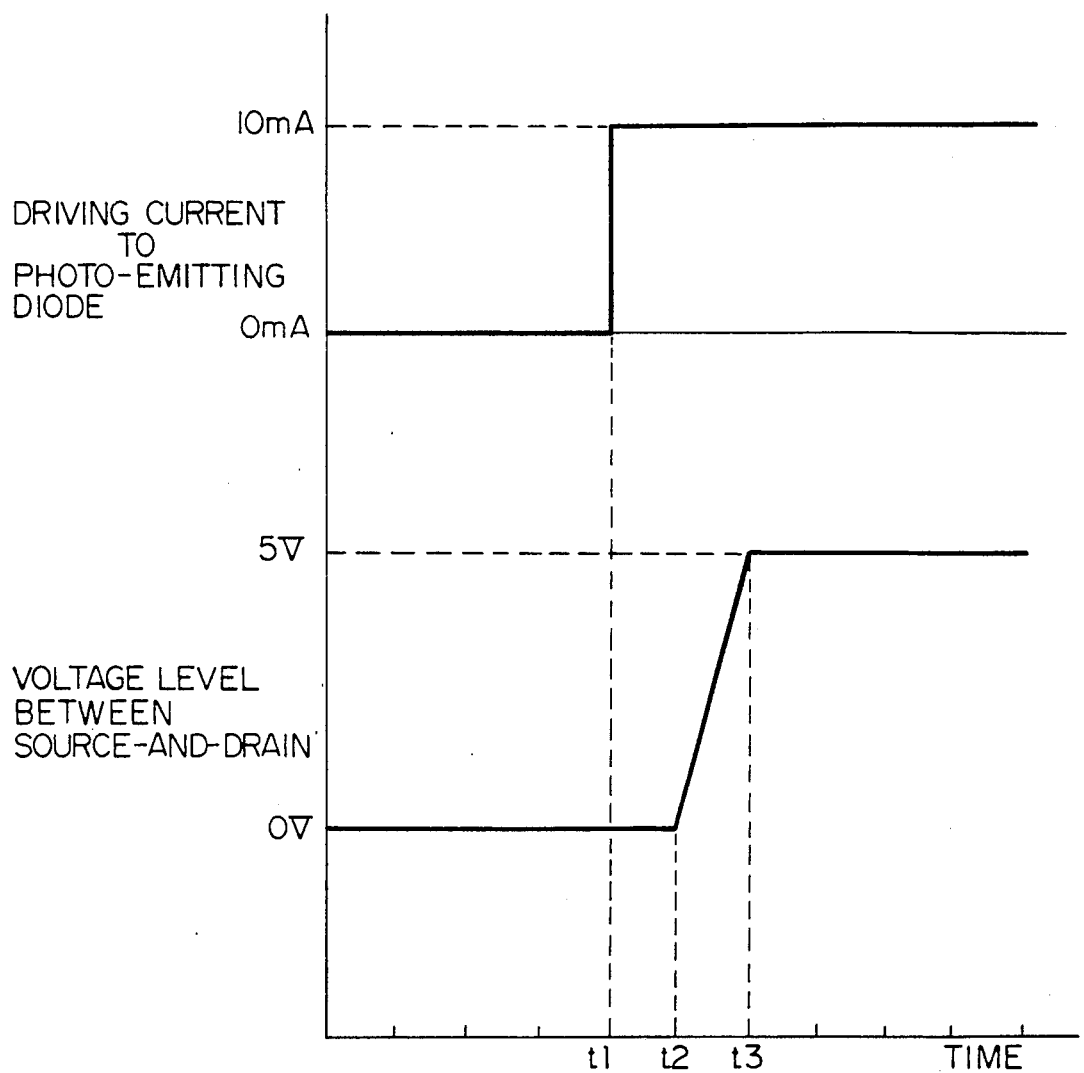

The enhancement mode field effect transistor 34 and the depletion mode field effect transistor 35 are different in switching characteristics from each other. FIGS. 8A and 8B show respective switching characteristics of the enhancement mode field effect transistor 34 and the depletion mode field effect transistor 35. An experience is carried out on the assumption that a load resistance of about 1 kilo-ohms is applied to each of the field effect transistors 34 and 35 and that a difference in voltage level of about 5 volts is applied between the source and drain electrodes of each of the field effect transistors 34 and 35.

If the driving current flows between the input terminals 31b and 31c at time t1, the gate capacitance of the enhancement type field effect transistor 34 is accumulated at t3 and the enhancement mode field effect transistor 34 turns on at time t4. The time period between time t1 to t3 is about 10 microsecond, and the enhancement mode field effect transistor 34 further consumes about 100 microsecond between time t3 and time t4. Then, the total amount of time period consumed is about 200 microsecond as shown in FIG. 8A. On the other hand, the depletion mode field effect transistor 35 completes the switching action between time t1 and time t3, and, therefore, consumes only about 100 microsecond. Thus, the depletion mode field effect transistor 35 completes the switching action from the on-state to the off-state faster than the enhancement mode field effect transistor 34, and, for this reason, no concurrent on-states take place if the circuit properties are slightly fluctuated during the manufacturing stage.

Figure 9A:
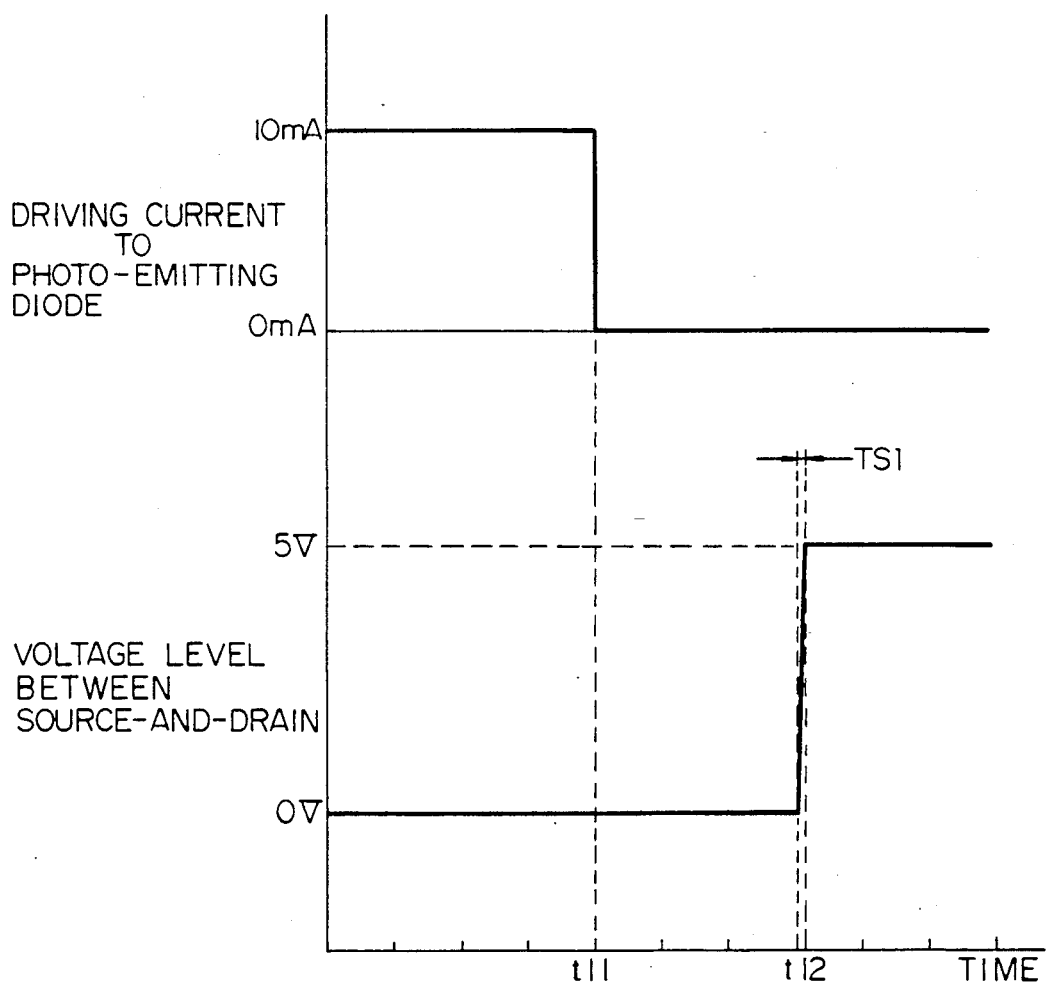
FIGS. 9A and 9B are diagrams showing the switching actions of the enhancement mode field effect transistor and the depletion mode field effect transistor upon removing the driving current.
Figure 9B:
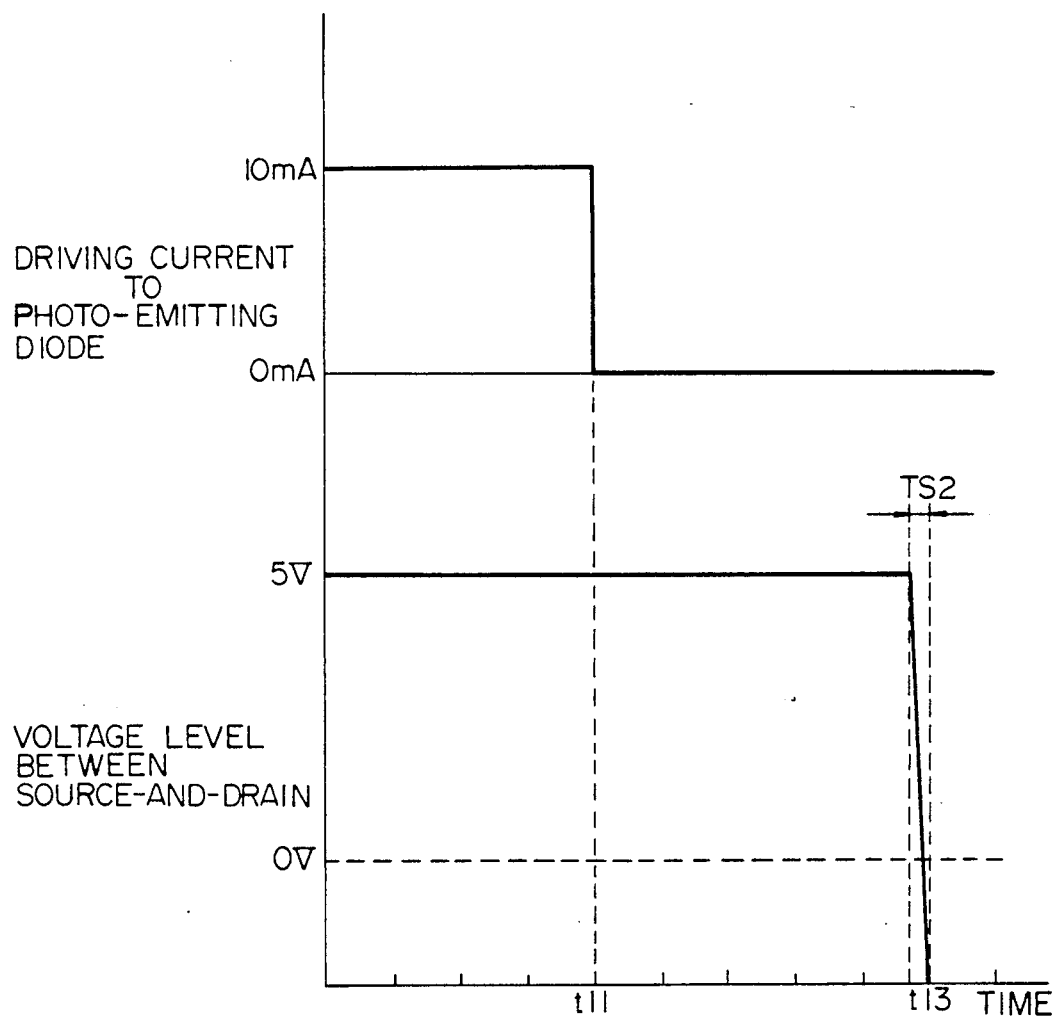

If the driving current is removed from the light-emitting diode 31a at time t11, the gate capacitance of the enhancement mode field effect transistor 34 is discharged, and the enhancement mode field effect transistor 34 is shifted from the on-state to the off-state at time t12 as shown in FIG. 9A. The switching action from the on-state to the off-state consumes about 32 microsecond, and a transit time period TS1 is about 1 microsecond. On the other hand, the depletion mode field effect transistor 35 completes the switching action at time t13 as shown in FIG. 9B, and the total amount of time period consumed by the depletion mode field effect transistor 35 is about 50 microsecond. However, a transit time period TS2 is about 1 microsecond.

Additionally, the enhancement mode field effect transistor 34 is about 200 volts in withstand voltage, about 1.2 ohm in on-resistance and about 140 pF in gate capacitance at 25 volts, and the depletion mode field effect transistor 35 is about 200 volts in withstand voltage, about 3 ohms in on-resistance and about 70 pF in gate capacitance at about 25 volts.

Thus, upon removing the driving current, the switching action of the enhancement mode field effect transistor 34 is faster than that of the depletion mode field effect transistor 35, and, for this reason, any concurrent on-states never take place in the solid state relay according to the present invention. In other words, the solid state relay according to the present invention surely achieves the transfer action upon not only application of the driving current but also removing it.

In addition, if the fifth diode 33d is removed from the second discharging circuit, the depletion mode field effect transistor 35 consumes about 40 microseconds for the switching action from the off-state to the on-state in the presence of the capacitor of about 4 pF. The second discharging circuit 33 without any capacitor decreases the time period for the switching action from the off-state to the on-state to about 38 microseconds. However, the enhancement mode field effect transistor 34 turns off earlier than the depletion mode field effect transistor 35 in either case.

In general, the transfer action is achieved if the following inequality is satisfied (when the driving current flows between the input terminals)

$$(C_E \times V_{TE})/I_E > (C_D \times V_{TD})/I_D$$

where $C_E$ is the gate capacitance of the enhancement mode field effect transistor 34, $V_{TE}$ is the threshold voltage level of the enhancement mode field effect transistor 34, $I_E$ is the amount of the first photocurrent, $C_D$ is the gate capacitance of the depletion mode field effect transistor 34, $V_{TD}$ is the threshold voltage level of the depletion mode field effect transistor 34, and $I_D$ is the amount of the second photocurrent. If an enhancement mode field effect transistor and a depletion mode field effect transistor are equal in on-resistance and in withstand voltage, the gate capacitance of the depletion mode field effect transistor tends to be larger than that of the enhancement mode field effect transistor. This is the reason why the depletion mode field effect transistor 35 has the relatively small absolute value of the threshold level with respect to the enhancement mode field effect transistor and the second photocurrent is much than the first photocurrent.

Second Embodiment

Figure 10:
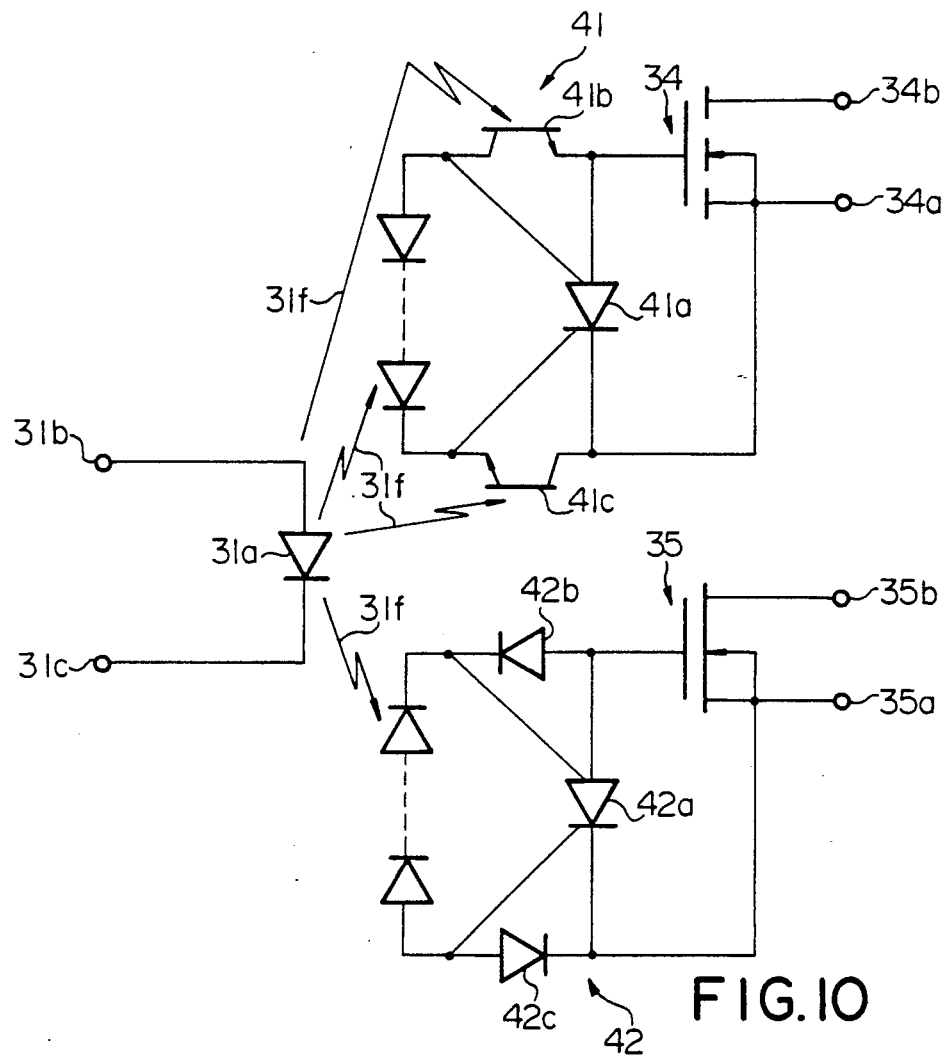
FIG. 10 is a circuit diagram showing the arrangement of another optically coupled solid state relay according to the present invention.

Turning to FIG. 10 of the drawings, another optically coupled solid state relay is illustrated. The solid state relay shown in FIG. 10 is similar to that shown in FIG. 4; however, a first discharging circuit 41 comprises a first thyristor 41a and first and second phototransistors 41b and 41c disposed in such a manner that the optical radiation is fallen thereonto, and a second discharging circuit 42 comprises a second thyristor 42a and sixth and seventh diodes 42b and 42c. The solid state relay thus arranged behaves as similar to that shown in FIG. 4 upon application of the driving current to the light-emitting diode 31a. When the driving current is removed, the first thyristor 41a turns off earlier than the second thyristor 42a because the phototransistors 41b and 41c promote the voltage decay.

As will be understood from the foregoing description, the solid state relay according to the present invention surely achieves the transfer action even though any fluctuation took place during the manufacturing stage and, therefore, is advantageous over the prior art solid state relay in reliability.

Figure 11:
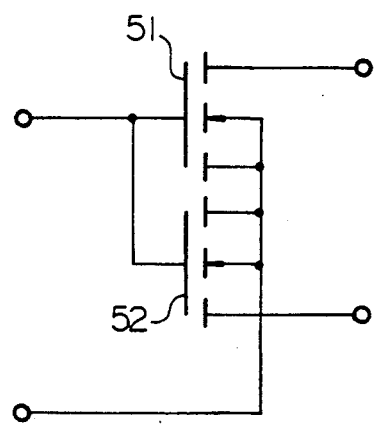
FIG. 11 is a circuit diagram showing an output circuit incorporated in either solid state relay according to the present invention.

Although particular embodiments of the present invention have been shown and described, it will be obvious to those skilled in the art that various changes and modifications may be made without departing from the spirit and scope of the present invention. For example, each of the output circuits 34 and 35 is implemented by a single enhancement mode or depletion mode transistor in the above described embodiments; however, each of the output circuits 34 and 35 may be formed by a pair of field effect transistors 51 and 52 coupled in series as shown in FIG. 11, and such an implementation can relay an ac current.

What is claimed is:

1. An optically coupled solid state relay comprising
(a) an optical coupler having a light-emitting element coupled between controlling terminals for producing an optical radiation in the presence of a driving current, first photovoltaic means for producing a first photocurrent at a first voltage level in the presence of said optical radiation and second photovoltaic means for producing a second photocurrent at a second voltage level in the presence of said optical radiation,
(b) a first output circuit having an enhancement mode field effect transistor coupled to said first photovoltaic means and provided in association with normally-open output terminals,
(c) a first discharging circuit activated in the absence of said optical radiation and discharging said first voltage level,
(d) a second output circuit having a depletion mode field effect transistor coupled to said second photovoltaic means and provided in association with normally-closed output terminals, and
(e) a second discharging circuit activated in the absence of said optical radiation and discharging said second voltage level, in which the amount of said second photocurrent is larger than that of said first photocurrent and said enhancement mode field effect transistor is larger in the absolute value of a threshold level than said depletion mode field effect transistor so that said depletion mode field effect transistor turns off before said enhancement mode field effect transistor turns on, wherein said first discharging circuit starts in a discharging operation thereof earlier than said second discharging circuit so that said enhancement mode field effect transistor turns off before said depletion mode field effect transistor turns on.

2. An optically coupled solid state relay as set forth in claim 1, in which said first photovoltaic means and said second photovoltaic means comprise a series combination of first photodiodes and a series combination of second photodiodes, respectively.

3. An optically coupled solid state relay as set forth in claim 2, in which each of said first photodiodes has a photo-electric converting area smaller than that of each of said second photodiodes, and in which the number of said first photodiodes is larger than that of said second photodiodes.

4. An optically coupled solid state relay as set forth in claim 2, in which said first discharging circuit comprises a first thyristor capable of short circuiting high and low voltage electrodes of said first photovoltaic means, a first diode coupled at the anode thereof to said high voltage electrode and at the cathode thereof to the anode of said first thyristor, and a second diode coupled at the anode thereof to the cathode of said first thyristor and at the cathode thereof to said low voltage electrode, and in which a gate electrode of said enhancement mode field effect transistor is coupled to the cathode of said first diode.

5. An optically coupled solid state relay as set forth in claim 4, in which said second discharging circuit comprises a second thyristor capable of short circuiting high and low voltage electrodes of said second photovoltaic means, a third diode coupled at the anode thereof to said high voltage electrode of said second photovoltaic means and at the cathode thereof to the anode of said second thyristor, a fourth diode coupled at the anode thereof to the cathode of said second thyristor and at the cathode thereof to said low voltage electrode of said second photovoltaic means, and a fifth diode coupled at the anode thereof to the cathode of said second thyristor and at the cathode thereof to the anode of said second thyristor, and in which a gate electrode of said depletion mode field effect transistor is coupled to the anode of said fourth diode.

6. An optically coupled solid state relay as set forth in claim 4, in which said second discharging circuit comprises a second thyristor capable of short circuiting high and low voltage electrodes of said second photovoltaic means, a third diode coupled at the anode thereof to said high voltage electrode of said second photovoltaic means and at the cathode thereof to the anode of said second thyristor, a fourth diode coupled at the anode thereof to the cathode of said second thyristor and at the cathode thereof to said low voltage electrode of said second photovoltaic means, and a capacitor coupled between the high and low voltage electrodes of said second photovoltaic means, and in which a gate electrode of said depletion mode field effect transistor is coupled to the anode of said fourth diode.

7. An optically coupled solid state relay as set forth in claim 4, in which said second discharging circuit comprises a second thyristor capable of short circuiting high and low voltage electrodes of said second photovoltaic means, a third diode coupled at the anode thereof to said high voltage electrode of said second photovoltaic means and at the cathode thereof to the anode of said second thyristor, a fourth diode coupled at the anode thereof to the cathode of said second thyristor and at the cathode thereof to said low voltage electrode of said second photovoltaic means, a fifth diode coupled at the anode thereof to the cathode of said second thyristor and at the cathode thereof to the anode of said second thyristor, and a capacitor coupled between the high and low voltage electrodes of said second photovoltaic means, and in which a gate electrode of said depletion mode field effect transistor is coupled to the anode of said fourth diode.

8. An optically coupled solid state relay as set forth in claim 2, in which said first discharging circuit comprises a first thyristor capable of short circuiting high and low voltage electrodes of said first photovoltaic means, a first phototransistor coupled between said high voltage electrode and the anode of said first thyristor, and a second phototransistor coupled between the cathode of said first thyristor and said low voltage electrode, and in which a gate electrode of said enhancement mode field effect transistor is coupled to the anode of said first thyristor.

9. An optically coupled solid state relay as set forth in claim 8, in which said second discharging circuit comprises a second thyristor capable of short circuiting high and low voltage electrodes of said second photovoltaic means, a sixth diode coupled at the cathode thereof to said low voltage electrode of said second photovoltaic means and at the anode thereof to the anode of said second thyristor, and a seventh diode coupled at the cathode thereof to the cathode of said second thyristor and at the anode thereof to said high voltage electrode of said second photovoltaic means, and in which a gate electrode of said depletion mode field effect transistor is coupled to the anode of said sixth diode.

10. An optically coupled solid state relay as set forth in claim 1, in which said first output circuit further comprises another enhancement mode field effect transistor coupled in series to said enhancement mode field effect transistor and in which said second output circuit further comprises another depletion mode field effect transistor coupled in series to said depletion mode field effect transistor.

* * * * *